US012694178B2

(12) United States Patent
Brault et al.

(10) Patent No.: US 12,694,178 B2
(45) Date of Patent: Jul. 28, 2026

(54) HYBRID SWITCHING ARCHITECTURE FOR SERDES COMMUNICATION CHANNELS IN RECONFIGURABLE HARDWARE MODELING CIRCUITS

(71) Applicant: Siemens Industry Software Inc., Plano, TX (US)

(72) Inventors: Jean-Marc Brault, Guyancourt (FR); Charles W. Selvidge, Oakland, CA (US); Jean-Paul Clavequin, Sevres (FR); Laurent Vuillemin, Montigny le Bretonneux (FR)

(73) Assignee: Siemens Industry Software Inc., Plano, TX (US)

( * ) Notice: Subject to any disclaimer, the term of this patent is extended or adjusted under 35 U.S.C. 154(b) by 786 days.

(21) Appl. No.: 18/041,136

(22) PCT Filed: Aug. 20, 2020

(86) PCT No.: PCT/US2020/047142
§ 371 (c)(1),
(2) Date: Feb. 9, 2023

(87) PCT Pub. No.: WO2022/039742
PCT Pub. Date: Feb. 24, 2022

(65) Prior Publication Data
US 2023/0306169 A1       Sep. 28, 2023

(51) Int. Cl.
*G06F 30/327* (2020.01)
*G06F 30/30* (2020.01)
(Continued)

(52) U.S. Cl.
CPC .......... *G06F 30/327* (2020.01); *G06F 30/331* (2020.01); *G06F 30/3312* (2020.01)

(58) Field of Classification Search
None
See application file for complete search history.

(56) References Cited

U.S. PATENT DOCUMENTS

| | | | | |
|---|---|---|---|---|
| 5,596,742 A | * | 1/1997 | Agarwal | G06F 30/331 |
| | | | | 326/38 |
| 7,379,859 B2 | * | 5/2008 | Goode | G06F 30/331 |
| | | | | 703/23 |

(Continued)

FOREIGN PATENT DOCUMENTS

| | | |
|---|---|---|
| CN | 105406931 A | 3/2016 |
| CN | 105794113 A | 7/2016 |

(Continued)

OTHER PUBLICATIONS

F. Brglez et al., "Combinational Profiles of Sequential Benchmark Circuits," ISCAS '89, 1989 IEEE, pp. 1929-1934. (Year: 1989).*

(Continued)

*Primary Examiner* — Leigh M Garbowski

(57) ABSTRACT

Various aspects of the present disclosed technology relate to hybrid static and dynamic switching in a reconfigurable hardware modeling circuit for flexible and low latency communications. The reconfigurable hardware modeling circuit comprises serializer circuitry and deserializer circuitry for one or more communication ports, wherein the serializer circuitry has first sub-channels for receiving data to be sent out from the reconfigurable hardware modeling circuit, and the deserializer circuitry has second sub-channels for outputting data received by the reconfigurable hardware modeling circuit. The reconfigurable hardware modeling circuit also comprises static switching circuitry configurable to couple each of first zero or one or more sub-channels in the first sub-channels with one of signal sources comprising the second sub-channels and dynamic switching circuitry configurable to couple, in a time-division (Continued)

Network subsystem in a certain configuration 500 multiplexing mode, each of second zero or one or more sub-channels in the first sub-channels with more than one of the signal sources.

18 Claims, 7 Drawing Sheets

(51) Int. Cl.
    *G06F 30/331*      (2020.01)
    *G06F 30/3312*    (2020.01)

(56) References Cited

U.S. PATENT DOCUMENTS

| | | | |
|---|---|---|---|
| 7,533,211 B2 | 5/2009 | Brunot | |
| 7,539,845 B1 * | 5/2009 | Wentzlaff | G06F 15/8007 |
| | | | 712/18 |
| 7,822,909 B2 | 10/2010 | Brunot | |
| 9,009,660 B1 * | 4/2015 | Griffin | G06F 8/445 |
| | | | 717/149 |
| 9,214,209 B2 * | 12/2015 | Ishiguro | H03K 19/1776 |
| 9,787,264 B2 * | 10/2017 | Gao | H03F 1/34 |
| 10,027,600 B2 * | 7/2018 | Kruecker | H04Q 11/08 |
| 10,394,653 B1 * | 8/2019 | Rosenbluth | G06F 11/141 |
| 10,594,607 B2 * | 3/2020 | Yu | H04L 49/254 |
| 11,275,598 B1 * | 3/2022 | Poplack | G06F 13/105 |

| | | | |
|---|---|---|---|
| 2002/0156614 A1 | 10/2002 | Goode | |
| 2007/0210826 A1 | 9/2007 | Madurawe | |
| 2016/0301414 A1 * | 10/2016 | Olbrich | H03K 19/0175 |
| 2020/0409709 A1 * | 12/2020 | ChoFleming | G06F 13/4022 |

FOREIGN PATENT DOCUMENTS

| | | |
|---|---|---|
| CN | 105981305 A | 9/2016 |
| CN | 111274183 A | 6/2020 |

OTHER PUBLICATIONS

J. Babb et al., "Logic Emulation with Virtual Wires," IEEE Trans. on Computer-Aided Design of Integrated Circuits and Systems, vol. 16, No. 6, Jun. 1997, pp. 609-626. (Year: 1997).*

Inagi, M. et al.; "Optimal Time-Multiplexing in Inter-FPGA Connections for Accelerating Multi-FPGA Prototyping Systems", IEICE Transaction on Fundamentals of Electronicas,Communications and Computer Sciences, Engineering Sciences Society, Tokyo, JP, vol. E91 A, No. 12, Dec. 1, 2008 (Dec. 1, 2008 ), pp. 3539-3547.

Inagi, Masago et al.; "Globally Optimal Time-Multiplexing in Inter-FPGA Connections for Accelerating Multi-FPGA Systems",Field Programmable Logic and Applications, 2009.FPL 2009. International Conferences On, IEEE, Piscataway, NJ, USA, Aug. 31, 2009 (Aug. 31, 2009), pp. 212-217.

* cited by examiner

HYBRID SWITCHING ARCHITECTURE FOR SERDES COMMUNICATION CHANNELS IN RECONFIGURABLE HARDWARE MODELING CIRCUITS

FIELD OF THE DISCLOSED TECHNOLOGY

The present disclosed technology relates to the field of circuit design verification. Various implementations of the disclosed technology may be particularly useful for flexible and low-latency communications between reconfigurable hardware modeling circuits in a reconfigurable hardware modeling device.

BACKGROUND OF THE DISCLOSED TECHNOLOGY

Electronic circuits, such as integrated circuits, are used in a variety of products, from automobiles to smart phones to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators/prototyping devices. The verification processes then are used to identify and correct errors in the design.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Description Language (HDL) (sometimes also referred to as hardware design language or hardware definition language), such as the Very high speed integrated circuit Hardware Description Language (VHDL) or the Verilog language. The logic of the circuit is then analyzed, to confirm that the logic incorporated into the design will accurately perform the functions desired for the circuit. This analysis is sometimes referred to as "functional verification."

Logic simulation is a tool used for functional verification. Designing hardware today involves writing a program in the hardware description language. A simulation may be performed by running that program on a computer. Such an electronic design simulator can determine what the various states of an electronic design would be when presented with some input stimulus. Simulators are commercially available such as the QUESTA family of simulators from Mentor Graphics Corporations of Wilsonville, Oregon.

Software-based simulation, however, may be too slow for large complex designs such as SoC (System-on-Chip) designs. The speed of execution of a simulator drops significantly as the design size increases due to cache misses and memory swapping. Emulation and prototyping significantly increase verification productivity by employing reconfigurable hardware modeling devices including emulators and prototyping devices. Field programmable gate arrays (FPGAs)-based emulators and prototyping devices rely on an actual silicon implementation and perform circuit verification generally in parallel as the circuit design will execute in a real device. By contrast, a simulator performs circuit verification by executing the hardware description code serially. The different styles of execution can lead to orders of magnitude differences in execution time. Examples of hardware emulators include the VELOCE family of emulators available from Mentor Graphics Corporation of Wilsonville, Oregon, the ZEBU family of emulators available from Synopsys, Inc. of Mountain View, California, and the PALLADIUM family of emulators available from Cadence Design Systems of San Jose, California.

A reconfigurable hardware modeling device is typically constructed by connecting a large number of homogenous or heterogeneous reconfigurable hardware modeling circuits. For example, a Veloce StratoM contains 1024 emulation computing devices and 256 non-computing switching devices. Larger systems might have 5000 or more total devices. Each of these reconfigurable hardware modeling circuits can be programmed to model some elements of an integrated circuit design, some elements of a testbench, or both. The testbench is used to create or apply stimuli to the modeled design in a verification process and to capture and evaluate responses from the modeled design to assess whether the design is behaving according to expectations.

While reconfigurable hardware modeling circuits are typically connected through high-speed links, most connections between them in a large system cannot be direct connections because there are not enough links per circuit to reach all other circuits. Moreover, circuit designs typically exhibit some degree of locality, and thus emulation systems modeling these circuit designs have inhomogeneity and locality in their interconnect networks. Some groups of reconfigurable hardware modeling circuits are more heavily connected together with multiple direct physical links and paths while other remote circuits/groups are connected more narrowly through non-direct paths potentially involving multiple intermediate nodes. Due to these characteristics, it is impractical to dedicate each of the physical communication channels connected to a reconfigurable hardware modeling circuit to traffic between a specific pair of circuits. On the other hand, sharing a physical communication channel by multiple links can introduce latency. Other disadvantages include contention and control resource limitations.

BRIEF SUMMARY OF THE DISCLOSED TECHNOLOGY

Various aspects of the present disclosed technology relate to techniques for employing hybrid static and dynamic switching in reconfigurable hardware modeling circuits for flexible and low latency communications. In one aspect, there is a reconfigurable hardware modeling device comprising: a plurality of reconfigurable hardware modeling circuits interconnected either directly or indirectly, wherein each of the plurality of reconfigurable hardware modeling circuits comprises: serializer circuitry and deserializer circuitry for one or more communication ports of the each of the plurality of reconfigurable hardware modeling circuits, the serializer circuitry having first sub-channels for receiving data to be sent out from the each of the plurality of reconfigurable hardware modeling circuits, the deserializer circuitry having second sub-channels for outputting data received by the each of the plurality of reconfigurable hardware modeling circuits, static switching circuitry configured, while implementing a hardware model of a circuit design in the reconfigurable hardware modeling device, to couple each of first zero or one or more sub-channels in the first sub-channels with one of signal sources during a verification process for the circuit design, the signal sources comprising the second sub-channels, and dynamic switching circuitry configurable, while implementing the hardware model of the circuit design in the reconfigurable hardware modeling device, to couple, in a time-division multiplexing mode, each of second zero or one or more sub-channels in the first sub-channels with more than one of the signal sources during the verification process for the circuit design.

The static switching circuitry and the dynamic switching circuitry may be configurable to operate with one or more same sub-channels in the second sub-channels.

The static switching circuitry may be configurable to couple a sub-channel in the second sub-channels with more than one of the first zero or one or more sub-channels in the first sub-channels.

The signal sources may further comprise a model computation subsystem in the each of the plurality of reconfigurable hardware modeling circuits, the model computation subsystem being coupled to the dynamic switching circuitry.

The reconfigurable hardware modeling device may further comprise: a plurality of network circuits configurable to assist communications between the plurality of reconfigurable hardware modeling circuits, wherein each of the plurality of network circuits comprises: another serializer circuitry and another deserializer circuitry for another one or more communication ports of the each of the plurality of network circuits, the another serializer circuitry having third sub-channels for receiving data to be sent out from the each of the plurality of network circuits, the another deserializer circuitry having fourth sub-channels for outputting data received by the each of the plurality of network circuits, another static switching circuitry configurable, while implementing the hardware model of the circuit design in the reconfigurable hardware modeling device, to couple each of third zero or one or more sub-channels in the third sub-channels with one of another signal sources during the verification process for the circuit design, the another signal sources comprising the fourth sub-channels, and another dynamic switching circuitry configurable, while implementing the hardware model of the circuit design in the reconfigurable hardware modeling device, to couple, in a time-division multiplexing mode, each of fourth zero or one or more sub-channels in the third sub-channels with more than one of the signal sources during the verification process for the circuit design.

The another static switching circuitry and the another dynamic switching circuitry may be configurable to operate with one or more same sub-channels in the fourth sub-channels.

The another static switching circuitry may be configurable to couple a sub-channel in the fourth sub-channels with more than one of the third zero or one or more sub-channels in the third sub-channels.

The serializer circuitry and the deserializer circuitry may conform to the Common Electrical I/O (CEI) Interoperability Agreements (IAs) published by the Optical Internetworking Forum (OIF).

The static switching circuitry is used for one or more links carrying timing-critical traffic in the verification process for the circuit design.

The reconfigurable hardware modeling device may be a processor-based emulator, and the plurality of reconfigurable hardware modeling circuits may be Boolean processor circuits.

The reconfigurable hardware modeling device may be an FPGA-based emulator or an FPGA-based prototyping device, and the plurality of reconfigurable hardware modeling circuits may be commercial FPGA chips or custom-designed FPGA chips.

In another aspect, there is a reconfigurable hardware modeling circuit comprising: a model computation subsystem; a network subsystem having connections to the model computation subsystem; and a plurality of communication ports, wherein the network subsystem comprises serializer circuitry and deserializer circuitry for one or more communication ports, wherein the serializer circuitry has first sub-channels for receiving data to be sent out from the reconfigurable hardware modeling circuit, and the deserializer circuitry has second sub-channels for outputting data received by the reconfigurable hardware modeling circuit. The reconfigurable hardware modeling circuit also comprises static switching circuitry configurable to couple each of first zero or one or more sub-channels in the first sub-channels with one of signal sources comprising the second sub-channels and dynamic switching circuitry configurable to couple, in a time-division multiplexing mode, each of second zero or one or more sub-channels in the first sub-channels with more than one of the signal sources.

The static switching circuitry and the dynamic switching circuitry may be configurable to operate with one or more same sub-channels in the second sub-channels.

The static switching circuitry may be configurable to couple a sub-channel in the second sub-channels with more than one of the first zero or one or more sub-channels in the first sub-channels.

The signal sources may further comprise the model computation subsystem, the model computation subsystem being coupled to the dynamic switching circuitry.

The serializer circuitry and the deserializer circuitry may conform to the Common Electrical I/O (CEI) Interoperability Agreements (IAs) published by the Optical Internetworking Forum (OIF).

The reconfigurable hardware modeling circuit may be a Boolean processor-based reconfigurable hardware modeling circuit, or an FPGA-based reconfigurable hardware modeling circuit.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1A:
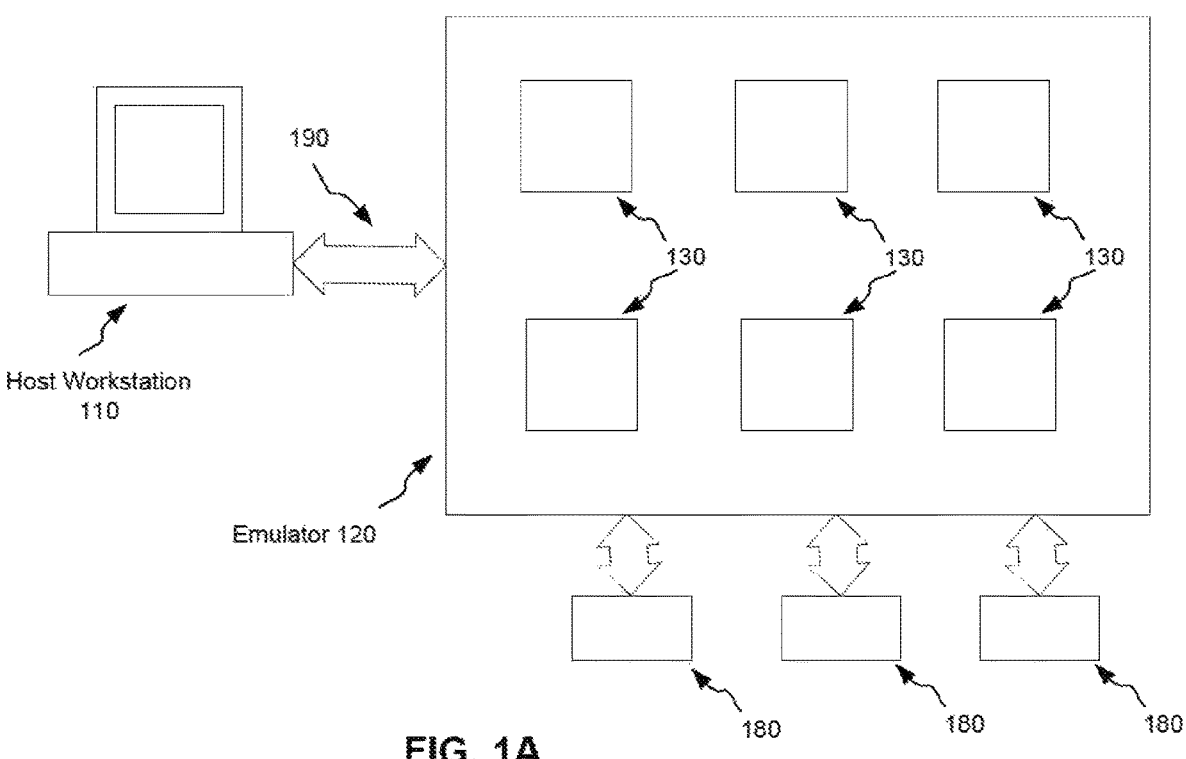
FIG. 1A shows an illustrative example of an emulation system with an emulator being coupled to targets.

Various aspects of the present disclosed technology relate to techniques for employing hybrid static and dynamic switching in reconfigurable hardware modeling circuits for flexible and low latency communications. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "operate" and "connect" to describe the disclosed methods/systems. Such terms are high-level descriptions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Hardware Modeling Environment

Reconfigurable hardware modeling devices can be emulators or prototyping devices. Two types of emulators have been developed. The first type is FPGA-based. In an FPGA-based architecture, each FPGA chip (reconfigurable hardware modeling circuit) has a network of prewired blocks of look-up tables and coupled flip-flops. A look-up table can be programmed to be a Boolean function, and each of the look-up tables can be programmed to connect or bypass the associated flip-flop(s). Look-up tables with connected flip-flops act as finite-state machines, while look-up tables with bypassed flip-flops operate as combinational logic. The look-up tables can be programmed to mimic any combinational logic of a predetermined number of inputs and outputs. To emulate a circuit design, the circuit design is first compiled and mapped to an array of interconnected FPGA chips. The compiler usually needs to partition the circuit design into pieces (sub-circuits) such that each fits into an FPGA chip. The sub-circuits are then synthesized into the look-up tables (that is, generating the contents in the look-up tables such that the look-up tables together produce the function of the sub-circuits). Subsequently, place and route are performed on the FPGA chips in a way that preserves the connectivity in the original circuit design.

The programmable logic chips (reconfigurable hardware modeling circuits) employed by an emulator may be commercial FPGA chips or custom-designed emulation chips containing programmable logic blocks. A custom FPGA-based emulator can have a specially designed internal interconnection network of programmable elements within each custom FPGA, an external interconnecting network and I/O structure of custom FPGAs, and a design-under-test debug engine. Such architecture enables, compared to a commercial FPGA-based counterpart, fast and correct-by-construction compilation and high design visibility in the silicon fabric that can assume 100% access without probe compilation and rapid waveform tracing. A commercial FPGA chip may have somewhat larger capacity density than a custom FPGA chip. For a given design, a custom FPGA-based emulator may need more FPGAs than a commercial FPGA-based emulator, leading to larger physical dimensions and higher power consumption.

The second type of emulators is processor-based: an array of Boolean processors (reconfigurable hardware modeling circuits) able to share data with one another is employed to map a circuit design, and Boolean operations are scheduled and performed accordingly. Similar to the FPGA-based, the circuit design needs to be partitioned into sub-circuits first so that the code for each sub-circuit fits the instruction memory of a processor. The compilation speed of a processor-based emulator, however, is much faster than those of a FPGA-based emulator. Drawbacks are limited speed of execution in a transaction-based mode, large power consumption, and large physical dimensions compared to a FPGA-based emulator.

An emulator may operate in various modes. In an in-circuit emulation mode, the emulator is connected with a user's target system to form a prototype of the system the user is designing. The emulator typically replaces the circuit being designed for the target system, allowing system-level and software testing prior to silicon availability. Although an emulator may run up to six orders of magnitude faster than a simulator, it is often not fast enough to run at the same speed of the physical target system (a few megahertz vs hundreds of megahertz). Speed rate adapters may be introduced between the target system and the emulator. A rate adapter behaves like a buffer. It caches the signal activity from the design-under-test (DUT) at emulation speed and sends it at real-time speed to the target system. Conversely, it captures the signal activity from the target system at full speed, caches it, and then sends it back to the DUT at emulation speed. Even when a rate adapter is available, the constant evolution of speed and complexity of individual I/O protocols may make timely rate adapter development difficult.

In an acceleration mode, the physical target system is replaced by a virtual target system modelled via one of the high-level languages such as SystemVerilog, SystemC, or C++.

The acceleration mode leverages the existing simulation testbench and removes the need for external rate adapters. The testbench creates test vectors and check corresponding responses of the circuit model. In addition to the elimination of speed adapters, the acceleration mode has advantages such as no hardware dependencies, the ability to use the emulator remotely, and the ability to run verification of corner cases.

The acceleration mode can be cycle-based or transaction-based. The cycle-based acceleration mode employs a signal-level or bit-level interface connecting the testbench processed by the host workstation to the design mode on the emulator. Each and every transition on each and every interface signal must be transferred between the testbench and the design model at the slow speed of the testbench simulated in the workstation. As a result, the speed of the emulator is wasted waiting to carry out these signal transfers.

The transaction-based acceleration reduces the traffic between workstation and emulator by replacing bit-by-bit exchanges with transaction exchanges. Data exchange is through so-called transactors. A transactor, including a front-end proxy interface on the workstation or host computer, a back-end bus-functional model on the emulator and a physical communication channel between the host computer and the emulator, converts high-level commands from the testbench on the host computer into signal-level bit sequences required by the design-under-test model on the emulator, and vice versa. This allows data being streamed and buffered between the testbench on the host computer and the design-under-test on the emulator, speeding up the execution of the testbench on the host computer. A design team can thus access the full performance of the emulator. In addition to performance, the transaction-based emulation eliminates the need for rate adapters. The design-under-test can connect to a "virtual device" (a software model of the device) that runs on the host computer through a transaction-level interface or to a physical device through a transaction-level interface and a "virtual device" acting as a bridging device.

In addition to emulators, reconfigurable hardware modeling devices also include FPGA prototyping devices. FPGA prototyping is typically deployed near the end of the verification process to catch system-level issues. For designs that rely heavily on commercial intellectual property (IP), an FPGA-based prototype is an ideal test platform for ensuring all IP components perform together. An FPGA-based prototype can also serve as a vehicle for software development and validation. Embedded software has become the dominant part of the effort in modern System-on-Chip (SoC) design. FPGA prototyping provides software developers early access to a fully functioning hardware platform well before real silicon. This enables early software development tasks such as operating system (OS) integration and application testing. The increased productivity of software development and validation greatly accelerates a product's time-to-market.

Compared to FPGA-based emulators which typically operate at one to two million cycles per second, FPGA prototypes are designed and built to achieve the highest speed of execution possible, allowing the extension of the speed range into tens of megahertz. The downside to FPGA prototyping is capacity limitations, limited debugging capabilities and long bring-up time. With growing complexity of FPGAs and advancement in both emulation and prototyping technologies, the lines between FPGA-based prototyping and emulation are increasingly blurring.

In some embodiments, the disclosed technology may be implemented as part of a hardware emulation environment, such as the one illustrated in FIG. 1A. As seen in this figure, the hardware emulation environment includes an emulator 120 coupled to a host computer or workstation 110. The workstation 110 may be implemented by one or more computing systems. One computing system may include a single computer or multiple computers (e.g., a master computer and a plurality of slave computers). The workstation provides the capability to load the DUV (design-under-verification, also referred to as DUT —design under test) model into the emulator, controls the execution of the DUV model on the emulator over time, and serves as a debugging interface into the DUV model on the emulator. As discussed previously, the workstation may include the testbench and perhaps other software models in some of the operational modes.

The emulator 120 includes multiple printed circuit boards (emulation circuit boards) 130. These emulation circuit boards 130 are networked (not shown). A circuit design may be partitioned by the workstation 110 and loaded to the emulation circuit boards 130 for emulation often along with testbench elements.

In the in-circuit emulation mode, one or more targets 180 may be coupled to the emulator 120 as shown in FIG. 1A. In some simple environments, a target may be a piece of test equipment that generates and verifies test data such as a network tester. In other environments, the target can be the actual circuitry with which the DUT model will interact in its final application (e.g., other hardware components of the system for which the DUT model is designed). A target can be either a static target or a dynamic target, depending on whether design clock signals run in the emulator can be suspended or not.

Figure 1B:
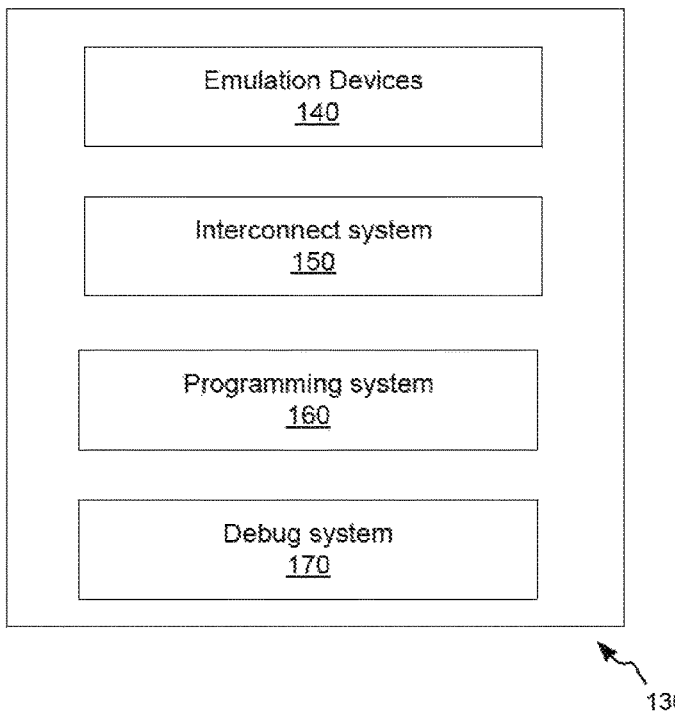
FIG. 1B shows an illustrative example of an emulation circuit board.

FIG. 1B illustrates an example of an emulation circuit board 130. The emulation circuit board 130 includes an array of emulation devices 140 (reconfigurable hardware modeling circuits). The emulation devices 140 can be programmed to model, for example, combinatorial logic elements, sequential circuit elements and memories. The emulation devices 140 may be processor-based or FPGA-based.

Also included in the emulation circuit board 130 are a configurable interconnect system 150, a programming system 160, and a debug system 170. A portion of a circuit design on one emulation device may need data computed by another portion of the design on another emulation device. The configurable interconnect system 150 allows data to be moved between emulation devices 140. In some implementations, the configurable interconnect system 150 may include a cross-bar device, a multiplexer, some other configurable network, or any combination thereof.

The programming system 160 enables a variety of other types of data to be brought in or out from an emulation device 140. Examples include programming data to configure an emulation device to perform a particular function, visibility data collected from the debug system 170 to be brought to the host workstation 110 for display, and content data either read from or written to memory circuitry in an emulation device 140.

The debug system 170 enables the emulation system to monitor the behavior of a modeled circuit design. Needed data for visibility viewing purposes can be stored in the debug system 170. The debug system 170 may also provide resources for detecting specific conditions occurring in the circuit design. Such condition detection is sometimes referred to as triggering.

The emulator 120 is coupled to the host workstation 110 through an interface system 190. The interface system 190 comprises one or more interfaces. A typical interface is optimized to transport large amounts of data such as data containing the emulated circuit design model (e.g., FPGA configuration bitstreams), initial contents of registers and design memories and data for debugging purposes. This interface is independent of design-under-test and may comprise dedicated logic or programmed logic in the emulator.

The interface system may also comprise one or more transaction-level interfaces. These interfaces may be optimized for small packets of data and fast streaming speed. The speed may be, for example, in the order of 2-3 Gigabits per second. The communication is performed through transactors as discussed previously. A transactor includes a back-end bus-functional model-instrumented logic in the emulator model, which requires the emulator infrastructure clock keep running even though the design clocks can be stopped.

It should also be appreciated that the emulation system in FIG. 1A and the emulation circuit board 130 in FIG. 1B are illustrated as examples only, and they are not intended to be limiting. Various embodiments of the disclosed technology may be implemented using only a subset of the components illustrated in the figures, or include an alternate combination of components, including components that are not shown in the figures.

Illustrative Computer-Based Operating Environment

Figure 2:
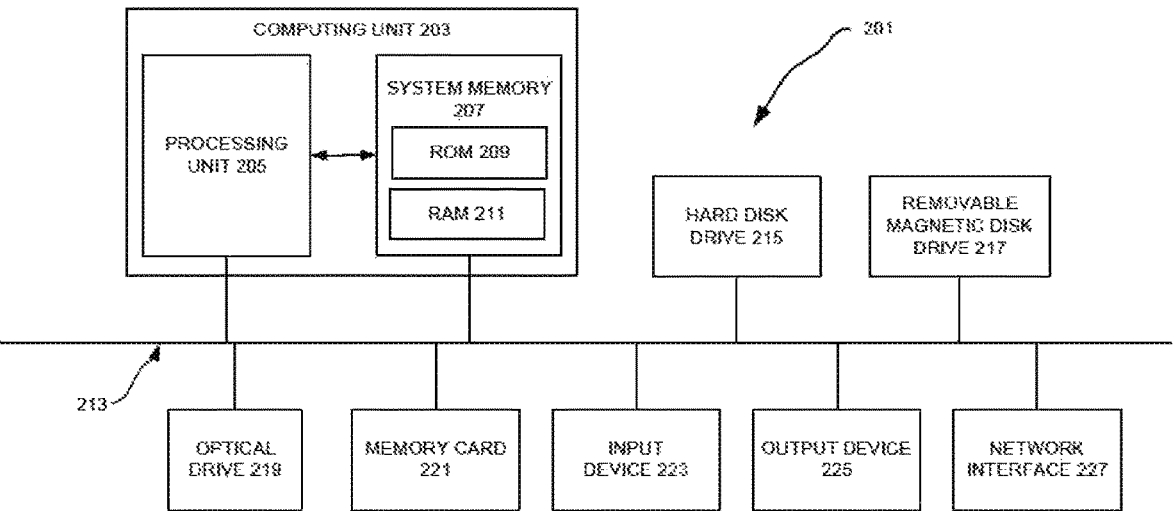
FIG. 2 illustrates a programmable computer system which various embodiments of the disclosed technology may employ.

FIG. 2 shows an illustrative example of a computing device 201 which may serve as the workstation 110 and/or implement various embodiments of a part or whole of the disclosed technology. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 203 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and is not intended to be limiting. Various embodiments of the disclosed technology may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the disclosed technology may be implemented using a multi-processor computer, a plurality of single and/or multiprocessor computers arranged into a network, or some combination of both.

Hybrid Network Based on Combining Dynamic and Static Switching

A reconfigurable hardware modeling device typically comprises a large number of reconfigurable hardware modeling circuits. A reconfigurable hardware modeling circuit can contain a sub-system for performing network switching functions (referred to as network subsystem) and a sub-system for model computations (referred to as model computation sub-system). The model computation sub-system is configured to perform logical functions on signal data (comprising locally generated data, locally stored data, data arriving via the network subsystem from other devices, or any combination thereof), and to send some data to other devices via the network subsystem. The network subsystem normally is responsible for communicating signal data with other circuits including other reconfigurable hardware modeling circuits such as delivering this signal data in or out of the reconfigurable hardware modeling circuit. The network subsystem may also be configured to transmit data from inputs to outputs, serving as a bridge between reconfigurable hardware modeling circuits which are not directly connected by a physical channel.

The bridge function is important because the large number of the reconfigurable hardware modeling circuits in a network cannot be connected to each other all by direct physical links. Only a limited number of physical communication channels can be connected to a reconfigurable hardware modeling circuit. The collection of physical links interconnecting modeling circuits in an emulator typically has inhomogeneity and locality in its interconnect networks with some groups of the reconfigurable hardware modeling circuits more heavily connected together with multiple direct physical links and paths than the other remote circuits/ groups. As such, network subsystems for some of the reconfigurable hardware modeling circuits need to serve as switching elements for non-direct paths between other reconfigurable hardware modeling circuits.

For the same reasons, a physical communication channel connected to a reconfigurable hardware modeling circuit often cannot be dedicated to traffic between a specific pair of circuits. Some physical communication channels transporting data out of a reconfigurable hardware modeling circuit may need to carry traffic to more than one destination, and some physical communication channels transporting data into a reconfigurable hardware modeling circuit may need to carry traffic from more than one source. For example, a reconfigurable hardware modeling circuit is typically configurable to take incoming time-multiplexed data from a communication channel and send data from different timeslots on that time-multiplexed communication channel to different outgoing communication channels. Similarly, a reconfigurable hardware modeling circuit is configurable to combine data from different timeslots on multiple communication channels to form a time-multiplexed data stream to be transmitted using a single outgoing communication channel. This method is sometimes referred to as time-division multiplexing. In addition to the type of traffic bridged by a reconfigurable hardware modeling circuit, there is also traffic originating or terminating at the model computation subsystem of a reconfigurable hardware modeling circuit.

Figure 3:
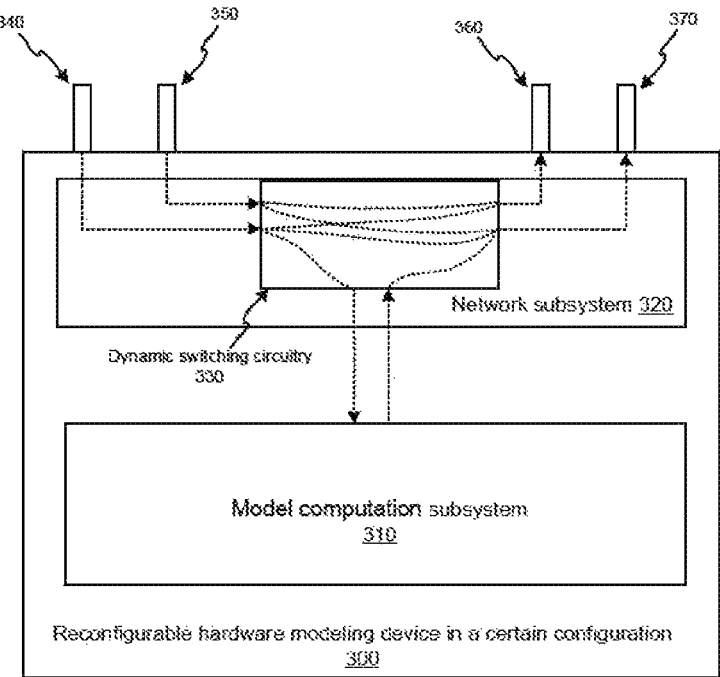
FIG. 3 illustrates an example of a reconfigurable hardware modeling circuit employing the dynamic switching technology to process time-multiplexed data streams which is configured for a certain design verification process.

FIG. 3 illustrates an example of a reconfigurable hardware modeling circuit 300 employing the dynamic switching technology to process time-multiplexed data streams which is configured for a certain design verification process. The reconfigurable hardware modeling circuit 300 comprises a model computation subsystem 310 and a network subsystem 320. The network subsystem 320 comprises dynamic switching circuitry 330. The figure also shows four communication channels 340, 350, 360 and 370, a subset of the communication channels connected to the reconfigurable hardware modeling circuit 300. The dynamic switching circuitry 330 is configured to receive data from the communication channel 340 and send data from different timeslots to at least three different locations: the model computation subsystem 310, the communication channel 360 and 370, respectively. The dynamic switching circuitry 330 is also configured to receive data from the communication channel 350 and send data from different timeslots to the communication channel 360 and 370, respectively. In addition to demultiplexing the received data, the dynamic switching circuitry 330 is configured to mix data from the communication channel 340, 350 and maybe other communication channels not shown to generate traffic for outputting through the communication channel 360, and to mix data from the communication channel 340, 350, the model computation subsystem 310, and maybe other communication channels not shown to generate traffic for outputting through the communication channel 370.

As the example shows, dynamic switching circuitry can demultiplex, align, switch and re-multiplex data streams and is thus very flexible for routing. However, dynamic switching circuitry can also introduce latency. The latency of the switching portion can be large because mixing data from the local compute subsystem with data being carried from input to output links needs high input cardinality switching elements. Latency in the communication system can have a negative impact on emulation system performance. Contention and control resource limitations are two other disadvantages associated with dynamic switching. Contention occurs when paths originating at distinct points may want to use the same communication channel at the same timeslot. This cannot be accomplished, and all candidates but one must wait. The more distinctly shared network links on a path, the higher the likelihood of contention impact on data carried by that communication channel. Control resources are the information that indicates the switch setting for a particular timeslot. Storage for this information is limited, thereby imposing a limit on the amount of data carried through dynamic switch controlled resources.

The serializer/deserializer (SerDes) technology is another technology that can be employed to compensate for limited input/output and increase the communication speed and capacity of a reconfigurable hardware modeling circuit. A serializer/deserializer link is a high-speed link, which can run typically at several or tens of Gb/s. Serializer/deserializer circuitry comprises serializer circuitry and deserializer circuitry. Serializer circuitry converts input parallel data-bits into serial data stream for transmission across a communication channel, and deserializer circuitry converts received data-bits from a serial data stream to a parallel form. Thus, serializer/deserializer circuitry can present a parallel interface to a reconfigurable hardware modeling circuit for a connected communication channel. The communication channel for SerDes can be a single line or a differential pair. Differential signaling sends the same electrical signal as a differential pair of signals, each in its own conductor. The pair of conductors can be wires (typically twisted together) or traces on a circuit board. The Optical Internetworking Forum (OIF) has published the Common Electrical I/O (CEI) Interoperability Agreements (IAs), that have defined five generations of the electrical interface of SerDes, at 3.125, 6, 10, 28 and 56 Gb/s.

A reconfigurable hardware modeling circuit can apply/ receive a set of independent data streams on each bit of the SerDes parallel interface running at a data rate of roughly 1/P of the SerDes transmission clock, where P is the width of the parallel interface. In practice, the SerDes transmission clock can run modestly faster than P times the data rate of input streams because there is coding and correction overhead data also to be transmitted. P can 2 to 16 or more.

Figure 4:
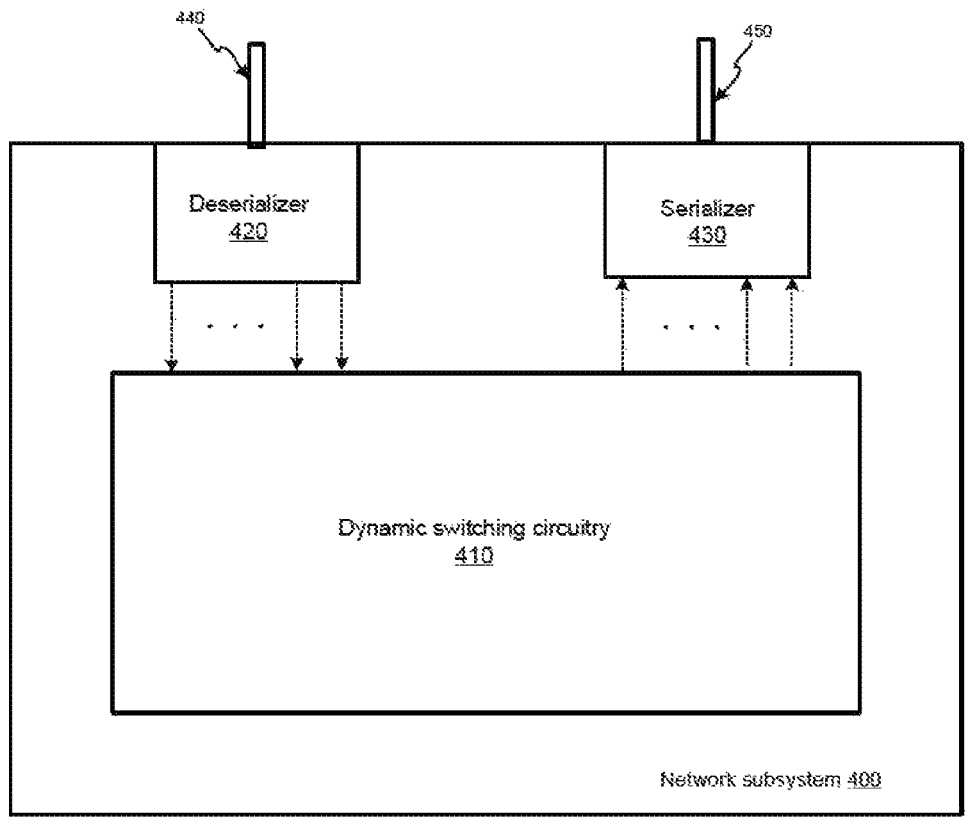
FIG. 4 illustrates an example of a network subsystem in a reconfigurable hardware modeling circuit which employs both the dynamic switching technology and the serializer/deserializer technology for communication links.

FIG. 4 illustrates an example of a network subsystem 400 in a reconfigurable hardware modeling circuit which employs both the dynamic switching technology and the serializer/deserializer technology for communication links. The network subsystem 400 comprises dynamic switching circuitry 410, deserializer circuitry 420 and serializer circuitry 430. Only two communication channels 440 and 450 are shown in the figure. The communication channel 440 is configured to be coupled to the deserializer circuitry 420 while the communication channel 450 is configured to be coupled to the serializer circuitry 430. Both of the deserializer circuitry 420 and the serializer circuitry 430 are coupled to the dynamic switching circuitry 410. As such, the communication channels 440 and 450 are associated with a set of parallel input channels and a set of parallel output channels of the dynamic switching circuitry 410, respectively. The dynamic switching circuitry 410 operates in a similar way as the dynamic switching circuitry 330 in FIG. 3, but treats each of the parallel inputs/outputs as a communication channel instead. This setup can increase bandwidth and communication speed, but latency still remains a problem, especially for some time-critical links.

Figure 5:
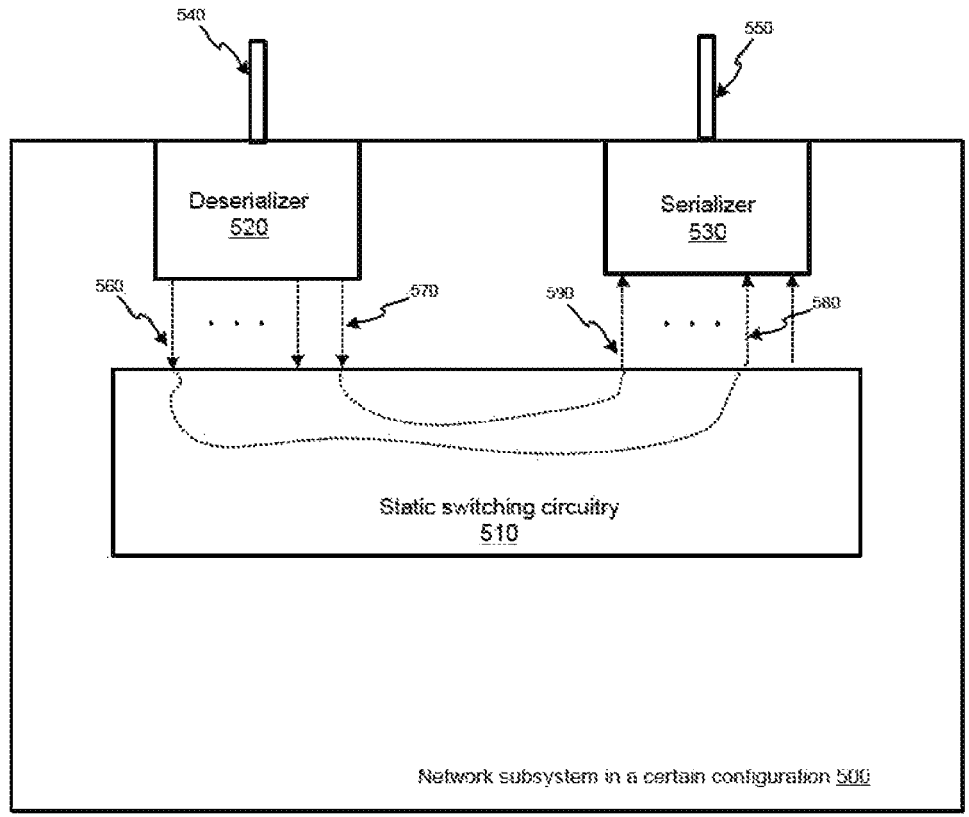
FIG. 5 illustrates an example of a network subsystem in a reconfigurable hardware modeling circuit which employs both the static switching technology and the serializer/deserializer technology for communication links and is configured for a certain design verification process.

FIG. 5 illustrates an example of a network subsystem 500 in a reconfigurable hardware modeling circuit which employs both the static switching technology and the serializer/deserializer technology for communication links and which is configured for a particular design verification process. The network subsystem 500 comprises static switching circuitry 510, deserializer circuitry 520 and serializer circuitry 530. Like FIG. 4, only two communication channels 540 and 550 are shown in the figure. The communication channel 540 is configured to be coupled to the deserializer circuitry 520 while the communication channel 550 is configured to be coupled to the serializer circuitry 530. Both of the deserializer circuitry 520 and the serializer circuitry 530 are coupled to the static switching circuitry 510. As such, the communication channels 540 and 550 are associated with a set of parallel input channels and a set of parallel output channels of the static switching circuitry 510, respectively.

Static switching circuitry does not change connection configuration at different clock cycles but can maintain a fixed connection configuration for a whole design verification process. Such a connection configuration can be changed to a different one when the reconfigurable hardware modeling circuit is configured for a different design. The static switching circuitry 510 is shown to connect two (560, 570) of the parallel input channels from the deserializer circuitry 520 with two (580, 590) of the parallel output channels to the serializer circuitry 530, respectively. Such a network for these connections would not take inputs from the local model computation subsystem, significantly decreasing the number of inputs to the switch. The combination of static switching re-configurability plus substantially decreased input count allows to create a switch circuit with appreciably low latency. This network structure is also significantly smaller than a dynamic switching network. This type of switching system is sometimes referred to as an IVW (Indirect Virtual Wire) switch, deriving from the fact that use of this switch inside one or several consecutive circuits creates an indirect virtual connection between a source and non-adjacent endpoint similar in nature as if there were direct connection but with longer latency.

While having a low latency advantage for indirect connections, static switching has some limitations. It is difficult to use static switching to manage locally generated data since local data connections have been omitted in order to have a small and fast switch. Static switching also lacks in flexibility since virtual channels on a physical link can only be allocated to a single source/destination path. Sending a single data value from a source to some specific destination requires allocation of a set of dedicated virtual channels from the source to the destination across intermediate resources. For a circuit with L physical communication channels and P width parallel interface to SERDES links, it is not possible to build a fully interconnected system with more than L*P circuits since a circuit needs at least one dedicated output or input channel to/from each other circuit.

Various embodiments of the disclosed technology combine dynamic and static switching for SerDes communication channels to take advantage of the benefits of the two technologies. A reconfigurable hardware modeling circuit comprises both dynamic switching circuitry and static switching circuitry. A sub-channel of a communication port of the reconfigurable hardware modeling circuit created by the deserializer circuitry can be configured to operate with one or both of the dynamic switching circuitry and the static switching circuitry. For timing-critical signals, static switching can be primarily or exclusively employed to reduce latency. For non-timing-critical traffic, dynamic switching can be used to increase bandwidth and flexibility.

Figure 6:
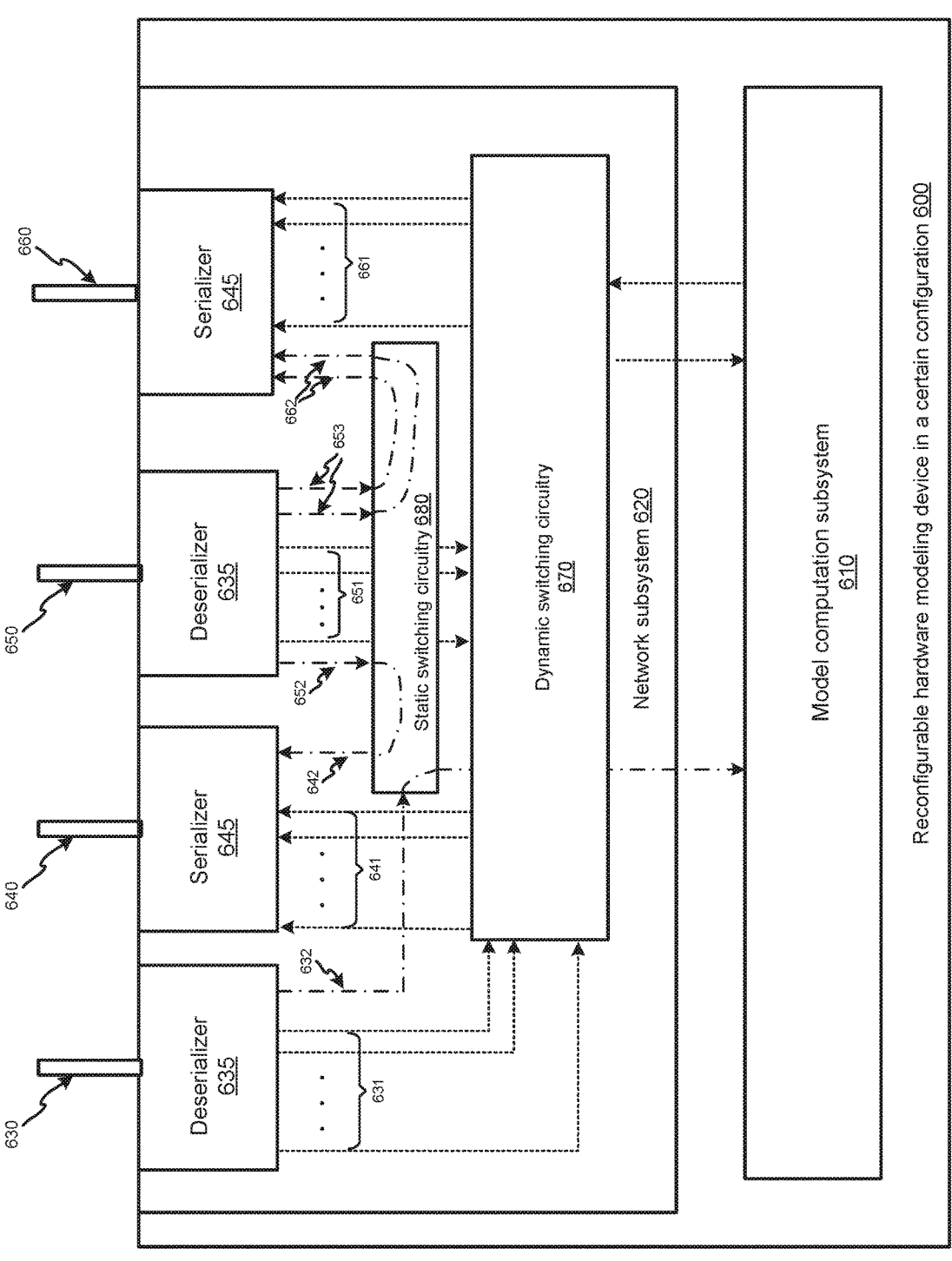
FIG. 6 illustrates an example of a reconfigurable hardware modeling circuit having a hybrid dynamic and static switching architecture in its network subsystem which is configured for a certain design verification process according to various embodiments of the disclosed technology.

FIG. 6 illustrates an example of a reconfigurable hardware modeling circuit 600 having a hybrid dynamic and static switching architecture in its network subsystem which is configured for a particular design verification process according to various embodiments of the disclosed technology. The reconfigurable hardware modeling circuit 600 comprises a model computation subsystem 610 and a network subsystem 620. The network subsystem 620 comprises serializer circuitry 645, deserializer circuitry 635, static switching circuitry 680, and dynamic switching circuitry 670. Communication channels 630, 640, 650 and 660 shown in the figure are a subset of the communication channels connected to the reconfigurable hardware modeling circuit 600 through corresponding communication ports. The communication channels 630 and 650 are configured to be coupled to the deserializer circuitry 635 while the communication channels 640 and 660 are configured to be coupled to the serializer circuitry 645. As a result, each of these communication channels are associated with a set of sub-channels: sub-channels 631 and 632 for the communication channel 630, sub-channels 641 and 642 for the communication channel 640, sub-channels 651, 652 and 653 for the communication channel 650, and sub-channels 661 and 662 for the communication channel 660.

The sub-channels 642 and 652, 653 and 662 are connected, by the static switching circuitry 680, to form indirect virtual wires, respectively. These indirect virtual wires serving as part of links between specific pairs of reconfigurable hardware modeling circuits during a verification process for a circuit design. The sub-channel 632 is also connected with the model computation subsystem 610 by the static switching circuitry [640] 680 as part of a link with another circuit. The dynamic switching circuitry [630] 670 is configured to operate with the rest of the sub-channels. Each of these sub-channels (631, 641, 651 and 661) can be shared by links between different pairs of reconfigurable hardware modeling circuits during the verification process of the circuit design. It is possible that a particular link has one section operated by the static switching circuitry and another section operated by the dynamic switching circuitry.

The configuration between the sub-channels and the static/dynamic switching circuitry is typically set up when the design-under-test is compiled and mapped to the array of interconnected reconfigurable hardware modeling circuits. The links for timing-critical signals are often formed using static switching. It should be noted that sub-channels for a particular communication channel can be all coupled to either the dynamic switching circuitry or the static switching circuitry or can be mixed with some sub-channels coupled to one and other sub-channels to the other. However, each sub-channel on outside (i.e., connected to the serializer circuitry) can be coupled to either the dynamic switching circuitry or the static switching circuitry, not both. Further, an input sub-channel can be coupled to one or more output sub-channels for the same communication channel and/or different communication channels by the static switching circuitry, one or more other output sub-channels for the same communication channel and/or different communication channels by the dynamic switching circuitry, or both.

Figure 7:
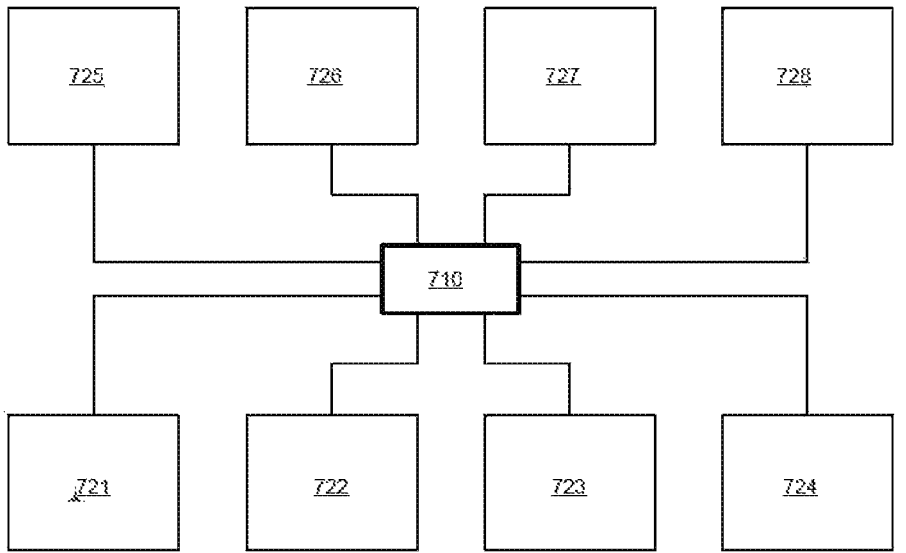
FIG. 7 illustrates an example of a node in an indirect communication network.

Networks for connecting reconfigurable hardware modeling circuits can be either direct or indirect networks. A direct network involves direct connections between subsets of reconfigurable hardware modeling circuits and purely direct networks mean that all network nodes are reconfigurable hardware modeling circuits. An indirect network, in contrast, involves the use of network circuits which are not reconfigurable hardware modeling circuits. These network circuits often perform only switching, routing, or both functions. FIG. 7 illustrates an example of a node in an indirect communication network. In the figure, eight reconfigurable hardware modeling circuits 721-728 are connected not to each other but to a network circuit 710 serving as a node. Emulation devices often employ hybrid networks. In a hybrid network, there are some direct connections between reconfigurable hardware modeling circuits comprising computing circuitry, but there are also some pure network circuits which connect together clusters of directly connected reconfigurable hardware modeling circuits.

In one example of a hybrid network, reconfigurable hardware modeling circuits are directly connected to other reconfigurable hardware modeling circuits on the same printed circuit board, but are indirectly connected through network circuits when sending data between circuit boards. Similarly, the same system has collections of emulation boards within chassis which can be interconnected and connections between circuits on different chassis pass through network circuits within each chassis, a first network circuit to reach an outbound path from the first chassis and a second network circuit from an inbound path on the second chassis to the eventual circuit. This use of indirect network elements to connect boards or chassis is common to allow a limited amount of interconnect wiring in/out of boards or in/out of systems to be shared symmetrically by all the reconfigurable hardware modeling circuits in the system. Interconnect resources are typically time multiplexed and this sharing can allow data from and to multiple distinct circuits to be carried on the scarce interconnect resources.

To reduce latency and to increase bandwidth and flexibility, a network circuit can also combine static and dynamic switching for SerDes communication channels. The configuration can be similar to the network subsystem of a reconfigurable hardware modeling circuit such as the examples described previously. According to various embodiments of the disclosed technology, a network circuit comprise serializer/deserializer circuitry for each communication channel connected to the network circuit, static switching circuitry configurable, as part of implementing a hardware model of a circuit design, to operate with one or more sub-channels of each of one or more communication channels, each of the one or more sub-channels serving as part of a link between two specific reconfigurable hardware modeling circuits during the verification process for the circuit design, and dynamic switching circuitry configurable, as the part of implementing the hardware model of the circuit design, to operate with other sub-channels of the each of one or more communication channels, each of the other sub-channels of the each of one or more other communication channels being shared by links between different pairs of reconfigurable hardware modeling circuits during the verification process of the circuit design.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A reconfigurable hardware modeling device comprising:

a plurality of reconfigurable hardware modeling circuits interconnected either directly or indirectly, wherein each of the plurality of reconfigurable hardware modeling circuits comprises:

serializer circuitry and deserializer circuitry for one or more communication ports of the each of the plurality of reconfigurable hardware modeling circuits, the serializer circuitry having first sub-channels for receiving data to be sent out from the each of the plurality of reconfigurable hardware modeling circuits, the deserializer circuitry having second sub-channels for outputting data received by the each of the plurality of reconfigurable hardware modeling circuits, static switching circuitry configurable, while implementing a hardware model of a circuit design in the reconfigurable hardware modeling device, to couple each of first zero or one or more sub-channels in the first sub-channels with one of signal sources during a verification process for the circuit design, the signal sources comprising the second sub-channels, wherein the static switching circuitry is configured to maintain a fixed connection configuration without changing the connection configuration at different clock cycles for the whole verification process, and dynamic switching circuitry configurable, while implementing the hardware model of the circuit design in the reconfigurable hardware modeling device, to couple, in a time-division multiplexing mode, each of second one or more sub-channels in the first sub-channels with more than one of the signal sources during the verification process for the circuit design.

2. The reconfigurable hardware modeling device recited in claim 1, further comprising:

a plurality of network circuits configurable to assist communications between the plurality of reconfigurable hardware modeling circuits, wherein each of the plurality of network circuits comprises:

another serializer circuitry and another deserializer circuitry for another one or more communication ports of the each of the plurality of network circuits, the another serializer circuitry having third sub-channels for receiving data to be sent out from the each of the plurality of network circuits, the another deserializer circuitry having fourth sub-channels for outputting data received by the each of the plurality of network circuits, another static switching circuitry configurable, while implementing the hardware model of the circuit design in the reconfigurable hardware modeling device, to couple each of third zero of one or more sub-channels in the third sub-channels with one of another signal sources during the verification process for the circuit design, the another signal sources comprising the fourth sub-channels, and another dynamic switching circuitry configurable, while implementing the hardware model of the circuit design in the reconfigurable hardware modeling device, to couple, in a time-division multiplexing mode, each of fourth one or more sub-channels in the third sub-channels with more than one of the signal sources during the verification process for the circuit design.

3. The reconfigurable hardware modeling device recited in claim 2, wherein the another static switching circuitry and the another dynamic switching circuitry are configurable to operate with one or more same sub-channels in the fourth sub-channels.

4. The reconfigurable hardware modeling device recited in claim 2, wherein the another static switching circuitry is configurable to couple a sub-channel in the fourth sub-channels with more than one of the third one or more sub-channels in the third sub-channels.

5. The reconfigurable hardware modeling device recited in claim 1, wherein the static switching circuitry and the dynamic switching circuitry are configurable to operate with one or more same sub-channels in the second sub-channels.

6. The reconfigurable hardware modeling device recited in claim 1, wherein the static switching circuitry is configurable to couple a sub-channel in the second sub-channels with more than one of the first one or more sub-channels in the first sub-channels.

7. The reconfigurable hardware modeling device recited in claim 1, wherein the signal sources further comprise a model computation subsystem in the each of the plurality of reconfigurable hardware modeling circuits, the model computation subsystem being coupled to the dynamic switching circuitry.

8. The reconfigurable hardware modeling device recited in claim 1, wherein the serializer circuitry and the deserializer circuitry conform to the Common Electrical I/0 (CEI) Interoperability Agreements (IAs) published by the Optical Internetworking Forum (OIF).

9. The reconfigurable hardware modeling device recited in claim 1, wherein the static switching circuitry is used for one or more links carrying timing-critical traffic in the verification process for the circuit design.

10. The reconfigurable hardware modeling device recited in claim 1, wherein the reconfigurable hardware modeling device is a processor-based emulator, and the plurality of reconfigurable hardware modeling circuits are Boolean processor circuits.

11. The reconfigurable hardware modeling device recited in claim 1, wherein the reconfigurable hardware modeling device is an FPGA-based emulator or an FPGA-based prototyping device, and the plurality of reconfigurable hardware modeling circuits are commercial FPGA chips or custom-designed FPGA chips.

12. A reconfigurable hardware modeling circuit comprising:

a model computation subsystem;
a network subsystem having connections to the model computation subsystem; and
a plurality of communication ports,
wherein the network subsystem comprises:
serializer circuitry and deserializer circuitry for one or more communication ports in the plurality of communication ports, the serializer circuitry having first sub-channels for receiving data to be sent out from the reconfigurable hardware modeling circuit, the deserializer circuitry having second sub-channels for outputting data received by the reconfigurable hardware modeling circuit,
static switching circuitry configurable to couple each of first one or more sub-channels in the first sub-channels with one of signal sources, the signal sources comprising the second sub-channels, wherein the static switching circuitry is configured to maintain a fixed connection configuration without changing the connection configuration at different clock cycles for an entire verification process, and
dynamic switching circuitry configurable to couple, in a time-division multiplexing mode, each of second one or more sub-channels in the first sub-channels with more than one of the signal sources.

13. The reconfigurable hardware modeling circuit recited in claim 12, wherein the static switching circuitry and the dynamic switching circuitry are configurable to operate with one or more same sub-channels in the second sub-channels.

14. The reconfigurable hardware modeling circuit recited in claim 12, wherein the static switching circuitry is configurable to couple a sub-channel in the second sub-channels with more than one of the first one or more sub-channels in the first sub-channels.

15. The reconfigurable hardware modeling circuit recited in claim 12, wherein the signal sources further comprise the model computation subsystem, the model computation subsystem being coupled to the dynamic switching circuitry.

16. The reconfigurable hardware modeling circuit recited in claim 12, wherein the serializer circuitry and the deserializer circuitry conform to the Common Electrical I/0 (CEI) Interoperability Agreements (IAs) published by the Optical Internetworking Forum (OIF).

17. The reconfigurable hardware modeling circuit recited in claim 12 is a Boolean processor-based reconfigurable hardware modeling circuit.

18. The reconfigurable hardware modeling circuit recited in claim 12 is an FPGA-based reconfigurable hardware modeling circuit.

* * * * *